United States Patent
Zilbauer

(10) Patent No.: US 10,175,829 B2
(45) Date of Patent: Jan. 8, 2019

(54) TRANSPARENT BODY WITH SINGLE SUBSTRATE AND ANTI-REFLECTION AND/OR ANTI-FINGERPRINT COATING AT AN OPPOSITE SIDE OF THE SUBSTRATE FROM A STRUCTURED TRANSPARENT CONDUCTIVE FILM, AND METHOD OF MANUFACTURING THEREOF

(71) Applicants: Applied Materials, Inc., Santa Clara, CA (US); Thomas Werner Zilbauer, Alzenau (DE)

(72) Inventor: Thomas Werner Zilbauer, Alzenau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 88 days.

(21) Appl. No.: 14/769,432

(22) PCT Filed: Mar. 15, 2013

(86) PCT No.: PCT/EP2013/055443
§ 371 (c)(1),
(2) Date: Aug. 20, 2015

(87) PCT Pub. No.: WO2014/139592
PCT Pub. Date: Sep. 18, 2014

(65) Prior Publication Data
US 2016/0004350 A1    Jan. 7, 2016

(51) Int. Cl.
*G06F 3/044* (2006.01)
*G02B 1/11* (2015.01)
(Continued)

(52) U.S. Cl.
CPC .............. *G06F 3/044* (2013.01); *C23C 14/34* (2013.01); *G02B 1/11* (2013.01); *G02B 1/115* (2013.01);
(Continued)

(58) Field of Classification Search
CPC ....... C23C 14/35; C23C 14/352; G02B 1/105; G02B 1/115; G02B 1/116; G02B 5/285;
(Continued)

(56) References Cited

U.S. PATENT DOCUMENTS

2005/0237307 A1    10/2005  Hieda et al.
2006/0147177 A1*  7/2006   Jing .......................... C08F 2/44
                                                              385/147
(Continued)

FOREIGN PATENT DOCUMENTS

EP          1544178         6/2005
JP       2010086684 A   *  4/2010

OTHER PUBLICATIONS

International Search Report and Written Opinion dated Feb. 14, 2014 for Application No. PCT/EP2013/055443.

*Primary Examiner* — Stephone B Allen
*Assistant Examiner* — Ryan S Dunning
(74) *Attorney, Agent, or Firm* — Patterson + Sheridan, LLP

(57) ABSTRACT

A process for manufacturing a transparent body for use in a touch screen panel is provided. The process includes depositing a first transparent layer stack over a first side of a transparent substrate, wherein said first transparent layer stack is selected from the group consisting of: a layer stack, wherein the layer stack includes a first dielectric film with a gradient refractive index from a first refractive index to a second refractive index, and a layer stack, wherein the layer stack includes at least a first dielectric film with a first (Continued)

refractive index and a second dielectric film with a second refractive index different from the first refractive index. The process further includes providing a structured transparent conductive film over the first side of the substrate, and depositing at least one first layer over a second side of the substrate wherein the second side opposes the first side, and wherein the at least one first layer is selected from the group consisting of: an anti-reflection layer and an anti-fingerprint layer.

20 Claims, 6 Drawing Sheets

(51) Int. Cl.
*G02B 1/18* (2015.01)
*H05K 3/02* (2006.01)
*C23C 14/34* (2006.01)
*G02B 1/115* (2015.01)
*G02B 27/00* (2006.01)
*G06F 3/042* (2006.01)

(52) U.S. Cl.
CPC ........... *G02B 1/18* (2015.01); *G02B 27/0006* (2013.01); *H05K 3/02* (2013.01); *G06F 3/0421* (2013.01); *G06F 2203/04103* (2013.01); *G06F 2203/04109* (2013.01)

(58) Field of Classification Search
CPC .. G02F 1/13338; G06F 3/03547; G06F 3/041; G06F 3/0488; G06F 2203/04103; G06K 11/06; H01J 37/3405; H01J 37/3414; H01J 37/3429; H01J 2237/332
USPC .............. 204/192.1, 192.11, 192.12, 192.22, 204/192.29, 298.04, 298.12, 298.23, 204/298.28; 345/173–178; 359/359, 577, 359/580, 585–588; 427/164, 166, 168; 428/1.1, 1.3, 1.5, 1.6, 212
See application file for complete search history.

(56) References Cited

U.S. PATENT DOCUMENTS

| | | |
|---|---|---|
| 2006/0290409 A1 | 12/2006 | Noguchi et al. |
| 2008/0138589 A1* | 6/2008 | Wakabayashi ......... H01H 13/83 428/195.1 |
| 2008/0152879 A1* | 6/2008 | Nashiki .................... C23C 14/08 428/212 |
| 2010/0013784 A1 | 1/2010 | Nashiki et al. |
| 2010/0013798 A1* | 1/2010 | Nakajima ............... G06F 3/044 345/176 |
| 2011/0242658 A1 | 10/2011 | Sarma |
| 2011/0318553 A1* | 12/2011 | Lotz ........................ C23C 14/34 428/212 |
| 2012/0114919 A1 | 5/2012 | Nakajima et al. |
| 2012/0188173 A1 | 7/2012 | Lin |
| 2013/0048354 A1* | 2/2013 | Lin ........................ H05K 1/097 174/257 |
| 2014/0016043 A1* | 1/2014 | Chen ...................... G06F 3/041 349/12 |

* cited by examiner

TRANSPARENT BODY WITH SINGLE SUBSTRATE AND ANTI-REFLECTION AND/OR ANTI-FINGERPRINT COATING AT AN OPPOSITE SIDE OF THE SUBSTRATE FROM A STRUCTURED TRANSPARENT CONDUCTIVE FILM, AND METHOD OF MANUFACTURING THEREOF

TECHNICAL FIELD

Embodiments of the present disclosure relate to processes and systems for manufacturing a transparent body for use in a touch screen panel and transparent bodies fabricated according to these processes.

BACKGROUND ART

Touch panels or touch screen panels are a particular class of electronic visual displays, which are able to detect and locate a touch within a display area. Generally, touch panels include a transparent body disposed over a screen and configured to sense a touch. Such a body is substantially transparent, so that light in the visible spectrum emitted by the screen can be transmitted there through. At least some known touch panels include a transparent body constituted by a barrier and a transparent conductor formed, in this order, over a substrate. A touch on the display area of such a panel generally results in a measurable change of capacitance in a region of the transparent body. The change in capacitance may be measured using different technologies, so that the position of the touch can be determined.

A transparent body for use with a touch panel is subject to some particular requirements. In particular, one key requirement is that the transparent body is stable enough for withstanding multiple contacts on the screen and harsh conditions, so that reliability of the touch screen is not compromised over time. However, at least some known transparent bodies included in touch screens, which are considered robust interfere with a proper transmission of light there through due to, for example, thickness, composition, and structure of the layers forming the transparent body. Furthermore, fabricating such a stable transparent body with high quality, for example with a uniform and defect-free barrier, is challenging.

Further, it is to be considered that there are different types of transparent bodies for touch panels. Particular consideration of the optical characteristics, e.g. the appearance to a user, has to be taken into account for transparent bodies, wherein the conductive layer for measuring the change in capacitance is a structured conductive layer.

A further aspect to be considered is a cost and material efficient solution for preventing the visibility or reducing the visibility of patterned portions of a touch panel. Thereby, particularly touch panels with integrated anti-reflection (AR) coating and/or anti-fingerprint (AF) coating are challenging because the AR coating and/or the AF coating increase the visibility of such patterned portions and can further develop over time, e.g. by abrasion of layers due to the use of the touch panel.

Accordingly, it is desirable to have a process and an apparatus for forming a high-quality transparent body for use in a touch panel in a manner such that the body is stably formed over the substrate without compromising a proper transmission, providing for touch sensor invisibility of light in the visible spectrum and reduced manufacturing costs.

SUMMARY OF THE INVENTION

In light of the above, a process according to independent claim 1, and a transparent body according to independent claim 13 are provided. Further aspects, advantages, and features of the present invention are apparent from the dependent claims, the description, and the accompanying drawings.

According to one embodiment, a process for manufacturing a transparent body for use in a touch screen panel or display panel is provided. The process includes depositing a first transparent layer stack over a first side of a transparent substrate, wherein said first transparent layer stack is selected from the group consisting of: a layer stack, wherein the layer stack includes a first dielectric film with a gradient refractive index from a first refractive index to a second refractive index, and a layer stack, wherein the layer stack includes at least a first dielectric film with a first refractive index and a second dielectric film with a second refractive index different from the first refractive index. The process further includes providing a structured transparent conductive film over the first side of the substrate, and depositing at least one first layer over a second side of the substrate wherein the second side opposes the first side, and wherein the at least one further layer is selected from the group consisting of: an anti-reflection layer and an anti-fingerprint layer.

According to another embodiment, a transparent body configured for use in a touch screen panel or display panel is provided. The transparent body includes a transparent substrate, a transparent layer stack deposited over the transparent substrate on a first side of the transparent substrate, wherein said transparent layer stack) is selected from the group consisting of: a layer stack, wherein the layer stack includes a first dielectric film with a gradient refractive index from a first refractive index to a second refractive index different from the first refractive index, and a layer stack, wherein the layer stack includes at least a first dielectric film with a first refractive index and a second dielectric film with a second refractive index different from the first refractive index. The transparent body further includes a transparent conductive film deposited over the transparent substrate on the first side of the transparent substrate and at least one first layer deposited over a second side of the substrate wherein the second side opposes the first side, and wherein the at least one further layer is selected from the group consisting of an anti-reflection layer and an anti-fingerprint layer.

Surprisingly, the combination of dielectric films deposited according to embodiments of the present disclosure result in a good invisibility for transparent bodies for touch panels, wherein a single substrate solution and an integration of AR and/or AF coating can be provided. Thereby, it is particularly beneficial to provide for an overall optical concept, i.e. to incorporate the optical properties of the AR and/or AF coating in the concept of providing an invisibly transparent body with touch detection capability. The use of a single substrate improves cost and material efficient manufacturing of transparent bodies, particularly under the boundary condition of improved optical performance, e.g. sunlight readability and/or reduced disturbances from fingerprints.

Embodiments are also directed to apparatuses for carrying out the disclosed processes and including apparatus parts for performing described process steps. Furthermore, embodiments are also directed to methods by which the described devices are manufactured. The methods may include method steps for manufacturing parts of the device. The method steps may be performed by way of hardware components, firmware, software, a computer programmed by appropriate software, by any combination thereof or in any other manner.

BRIEF DESCRIPTION OF THE DRAWINGS

A full and enabling disclosure, including the best mode thereof, to one of ordinary skill in the art, is set forth more particularly in the remainder of the specification, including reference to the accompanying figures, wherein.

DETAILED DESCRIPTION OF THE INVENTION

Reference will now be made in detail to the various embodiments, one or more examples of which are illustrated in the figures. Each example is provided by way of explanation, and is not meant as a limitation of the invention. It is contemplated that elements of one embodiment may be advantageously utilized in other embodiments without further recitation.

Figure 1A:
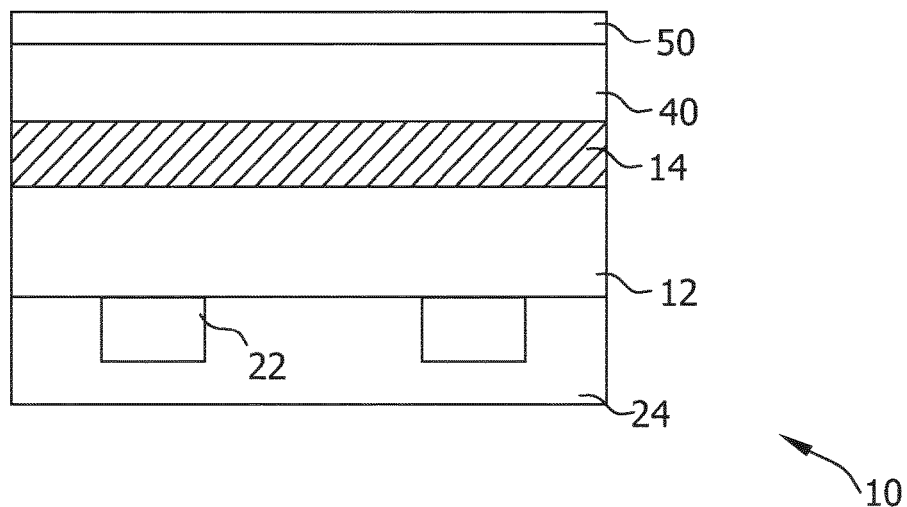
FIG. 1A is a schematic representation of an exemplary transparent body for use in a touch panel in accordance with embodiments herein.
Figure 1B:
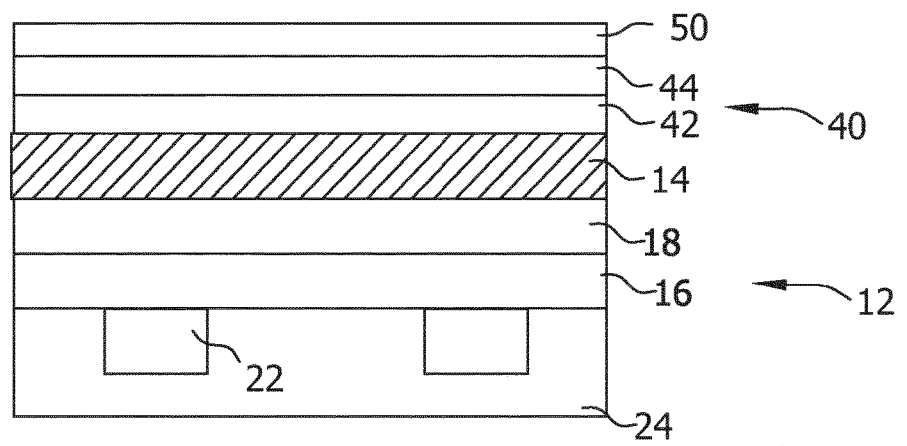
FIG. 1B is a schematic representation of an exemplary transparent body for use in a touch panel in accordance with embodiments herein.

According to embodiments herein, a first transparent layer stack 12, as depicted in FIGS. 1A and 1B, is deposited over a first side of a substrate 14, e.g. the lower side shown in FIG. 1A. The term "substrate" as used herein shall embrace both inflexible substrates, e.g., a wafer, slices of transparent crystal such as sapphire or the like, or a glass plate, and flexible substrates such as a web or a foil. The term "transparent" as used herein shall particularly include the capability of a structure to transmit light with relatively low scattering, so that, for example, light transmitted therethrough can be seen in a substantially clear manner. In the case of a flexible substrate, it is typical that substrate 14 has a hard coat formed thereon. According to typical embodiments the substrate can be rigid or flexible, e.g. glass or PET, PI. It can be used as an outer cover (i.e. the cover lens) for a display or touch screen product (TSP).

According to some embodiments, which can be combined with other embodiments described herein, a substrate can include opaque or colored regions, e.g. black matrix for the touch screen bezel, or metal leads in the bezel zone, or metal based bridges, which are used to connect different transparent conductor electrodes.

According to typical embodiments, a layer stack is constituted by a number of films formed (e.g., by deposition) one atop of another. In particular, embodiments herein include depositing a first transparent layer stack which may be constituted by a plurality of dielectric films, that is, films that, substantially, do not conduct electricity. In particular, first transparent layer stack 12 may include a first dielectric film 16, and a second dielectric film 18, as exemplarily depicted in FIG. 1B.

As shown in FIGS. 1A and 1B, a structured transparent conductive oxide (TCO) film 22 is provided such that the transparent layer stack is provided between the substrate 14 and the TCO layer 22. Even though the TCO layer 22 is below the transparent layer stack in FIGS. 1A and 1B, this is due to the fact that the transparent body 10 has been flipped. Typically, when reference is made to the term "over", i.e. one layer being over the other, it is understood that, starting from the substrate, a first layer is deposited over the substrate, and a further layer, deposited after the first layer, is thus over the first layer and over the substrate. In other words, the term "over" is used to define an order of layers, layer stacks, and/or films wherein the starting point is the substrate. This is irrespective of whether the transparent body is depicted upside down or not.

According to typical embodiments, the structured TCO layer can be provided by depositing a TCO layer and patterning the TCO layer in order to provide a structured TCO layer. Alternatively, a mask and/or a photoresist can be provided to deposit the structured TCO layer. According to typical embodiments, the TCO film is provided directly on the first transparent layer stack 12, wherein the first transparent layer stack includes at least a first and a second dielectric layer. Further, typically, the first transparent layer stack can be directly provided on the substrate. According to some embodiments, which can be combined with other embodiments described herein, there is no layer of optical clear adhesive and no air gap between the substrate and the TCO layer 22.

According to typical embodiments, which can be combined with other embodiments described herein, the transparent conductive oxide layer can be an indium tin oxide (ITO) layer, a doped ITO layer, impurity-doped ZnO, $In_2O_3$, $SnO_2$ and CdO, ITO ($In2O3:Sn$), AZO ($ZnO:Al$), IZO ($ZnO:In$), GZO ($ZnO:Ga$), multi-component oxides including or consisting of combinations of $ZnO$, $In_2O_3$ and $SnO_2$, a layer stack from at least an ITO layer and a metal layer, e.g. an ITO/metal/ITO-stack or a metal/ITO/metal-stack.

FIGS. 1A and 1B further show a transparent adhesive 24, which is utilized to connect the transparent body 10 with another portion of a touch screen, e.g. a color filter, a further transparent body, or a display (e.g. a TFT display) or any other portion of an optoelectronic device to form a touch panel.

FIGS. 1A and 1B further show an anti-reflection (AR) coating 40 and an anti-fingerprint (AF) coating deposited in this order over the second side of the substrate 14, wherein the second side opposes the first side. Thereby, the AR coating can typically include one or more dielectric films, wherein due to a sequence of refractive indices an AR property is generated.

According to yet further embodiments, which can be combined with other embodiments described herein, the AR coating can be omitted and only an AF coating can be provided. Thereby, it has to be considered that the transparent bodies as described herein having a single substrate, wherein a TCO film, a transparent layer stack configured for "invisibility" of the pattern of the TCO film, and at least one of an AR coating and an AF coating, can be provided as a cover lens of a touch panel or as an internal structure of a touch panel, as will be described in more detail below. Thereby, the transparent body having the AF coating forms a cover lens, i.e. forms the outermost portion of a touch panel. If the transparent body forms the outermost portion of the touch panel, an AF coating is provided in order to reduce the effect of fingerprints of a user. Optionally, an AR coating can thereby be provided between the substrate and the AF coating. If a transparent body is provided inside a touch panel structure as described with respect to FIGS. 2A and 2B below, there is no need for an AF coating because the top layer of single substrate transparent body is within the touch panel stack. In this case, an AR coating is provided as described below.

Conventional layer stacks or transparent bodies for touch panels can result in a functional screen (like a touch screen). However, an inferior sunlight readability, a colored appearance (reflectance) of the screen and a color change with respect to the produced picture from the underlying display, and a more or less visible pattern from the structured core layer of the functional screen (e.g. a patterned transparent conductive oxide, TCO) is often obtained. According to some further optional considerations, the conductivity might not be sufficient for large area touch panels, e.g. touch panels with a diagonal of 7 inches or more, specifically for touch screens with a diagonal of more than 20 inches.

Due to the structure of the transparent layer stack, it is facilitated that the conductive film does not prejudice an optimal transmission of light through the body. In particular, a transparent layer stack according to embodiments herein facilitates that a conductive film, even a structured conductive film, does not affect the neutrality of the reflectance color, as further discussed below.

In the past, it has been shown that a transparent layer stack with dielectric layers having predetermined refractive indices can be used to improve the visual appearance of touch panels. However, particularly for additional AR and/or AF coating according to embodiments described herein, and also optionally for thicker (low resistance) TCO structures, additional effort needs to be taken. Thereby, particularly the optical properties of a majority of the layers in the transparent layer stack have to be considered. That is beyond the compensation of a patterned TCO layer on a substrate by use of dielectric layers, which has initially been done irrespective of the bonding scheme and other properties, the refractive index of a transparent adhesive, the refractive index of an AR coating, and preferably also the optical properties, e.g. the refractive index, of an AF coating are combined to an entire structure, wherein the improvement of visual appearance is conducted for the entire body.

According to embodiments described herein, an enhanced structure and method of manufacturing such an invisible object, e.g. a touch sensor, are provided to surpass limitations to the use of AR and/or AF coatings and arising from the integration thereof. Layer stacks or transparent bodies as described herein, which are provided on a display, or the like are considered invisible when placed in an atmosphere of air (refractive index 1) with very little difference in the optical appearance between areas with and without the TCO layer, such as ITO ("invisible" ITO).

As shown in FIG. 1A a transparent adhesive 24 is provided over the TCO layer 22, i.e. such that the TCO layer 22 is between the transparent adhesive and the substrate.

According to typical, optional implementation, the transparent adhesive can be an optical clear adhesive laminate or liquid optical clear adhesive with a refractive index of 1.3 to 1.7, e.g. a refraction index close to the refractive index of glass (1.48) or PMMA (1.6), hence, as a further example, in the range between 1.48 and 1.6. According to yet further embodiments, which can be combined with other embodiments described herein, the transparent adhesive 24 can have a visual transmittance of 95% or above, 97% or above, or even 99% or above, and can have a low haze, e.g. of 3% or below, 2% or below, or even 1% or below. Thereby, the optical properties of the transparent adhesive are typically taken into account for forming the transparent body with the improved visual appearance.

According to typical embodiments, which can be combined with other embodiments described herein, the transparent adhesive can be configured for attaching the layer stack or transparent body to the adjacent components of the touch panel or display panel, e.g. any of the opto-electronic devices (touch screens, color filters, touch panels, displays, display panels, etc.) for which the transparent body can be utilized.

According to embodiments described herein, which can be combined with other embodiments described herein, the AR coating can include two, three, four or more dielectric layers, wherein typically a first layer has a first refractive index and a second layer has a second refractive index different from the first refractive index. For example, the first layer can be NbOx, e.g. Nb2O5 and second layer can be SiOx, e.g. SiO2. Further, layers can also be NbOx and SiOx in alternation. Thereby, films having lower refractive indexes can be provided by films containing SiOx, MgFx, SiOxNy, or the like. For example, films having a higher refractive index can be provided by films containing NbOx, SiNx, SiOxNy, AlOx, AlOxNy, TiOx TaOx, or the like. According to typical embodiments, which can be combined with other embodiments described herein, dielectric films with lower refractive index, for example lower than 1.60 or, more specifically, lower than 1.52 or, even more specifically, lower than 1.49 and dielectric films with higher refractive indexes, for example of at least 1.80 or, more specifically, at least 2.10, or, even more specifically, at least 2.30 are provided in an alternating manner.

According to yet further embodiments, which can be combined with other embodiments described herein, the AR coating can also be provided by one dielectric layer and an AF coating having predetermined optical properties. For example, a high refractive index layer can be combined with an AF coating to form an AR coating.

According to typical embodiments, the AF coating can thus have a low effective refractive index, for example lower than 1.70 or, more specifically, lower than 1.52 or, even more specifically, lower than 1.49. Thereby, reference is made to an effective refractive index for AF coating; the AF coating, which might have a certain roughness or porosity, will be described by an effective refractive index (Bruggemann mean field approximation).

Typically, there are two types of AF coatings. One option are oleophilic (or lipophilic) and hydrophilic, i.e. amphiphilic, materials, wherein fingerprints are distributed, e.g. evenly distributed. The second option is oleophobic (or lipophobic) and hdyrophobic, i.e. amphiphobic, materials, wherein water and oil is rejected. Such materials can be based on the lotus effect, the electronegativity of Fluorine containing materials. Further, according to some optional implementations the AF coating can also be a layer stack.

Figure 2A:
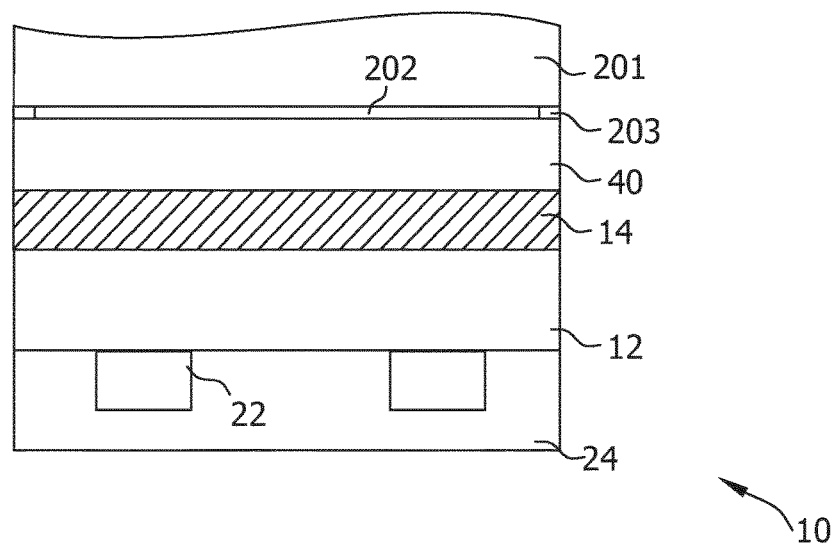
FIG. 2A is a schematic representation of a further exemplary transparent body for use in a touch panel and an opto-electronic device to which the body is bonded in accordance with embodiments herein.
Figure 2B:
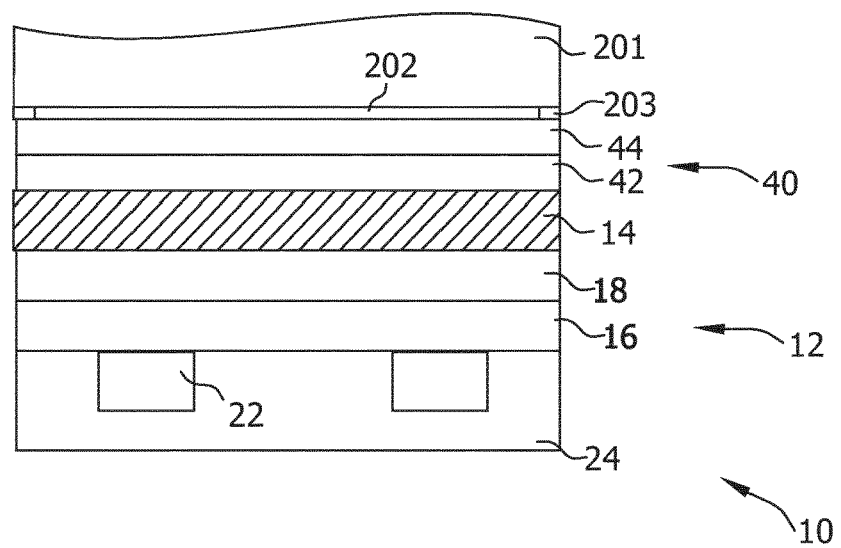
FIG. 2B is a schematic representation of a further exemplary transparent body for use in a touch panel and an opto-electronic device to which the body is bonded in accordance with embodiments herein.

According to some embodiments herein, a first transparent layer stack 12, as depicted in FIGS. 2A and 2B, is deposited over a first side of a substrate 14, e.g. the lower side shown in FIG. 2A. Typically, for embodiments described with respect to FIGS. 2A and 2B, i.e. where an inner portion of a TSP is provided, the substrate can be a glass, a foil, a polarizer, a retarder or combinations thereof.

According to typical embodiments, a layer stack is constituted by a number of films formed (e.g., by deposition) one atop of another. In particular, embodiments herein include depositing a first transparent layer stack which may be constituted by a plurality of dielectric films, that is, films that, substantially, do not conduct electricity. In particular, first transparent layer stack 12 may include a first dielectric film 16, and a second dielectric film 18, as exemplarily depicted in FIG. 2B.

As shown in FIGS. 2A and 2B, a structured transparent conductive oxide (TCO) film 22 is provided such that the transparent layer stack is provided between the substrate 14 and the TCO layer 22. According to typical embodiments, the structured TCO layer can be provided by depositing a TCO layer and patterning the TCO layer in order to provide a structured TCO layer. Alternatively, a mask and/or a photoresist can be provided to deposit the structured TCO layer. According to typical embodiments, the TCO film is provided directly on the first transparent layer stack 12, wherein the first transparent layer stack includes at least a first and a second dielectric layer. Further, typically, the first transparent layer stack can be directly provided on the substrate. According to some embodiments, which can be combined with other embodiments described herein, there is no layer of optical clear adhesive and no air gap between the substrate and the TCO layer 22.

FIGS. 2A and 2B further show a transparent adhesive 24, which is utilized to connect the transparent body 10 with another portion of a touch screen, e.g. a color filter, a further transparent body, or a display (e.g. a TFT display) or any other portion of an optoelectronic device to form a touch panel.

FIGS. 2A and 2B further show an anti-reflection (AR) coating 40 over the second side of the substrate 14, wherein the second side opposes the first side. Thereby, the AR coating can typically include one or more dielectric films, wherein due to a sequence of refractive indices an AR property is generated.

As shown in FIGS. 2A and 2B, the transparent body 10 is connected via an air gap 202 to a further portion 201 of an optoelectronic device. This can be a further transparent body, a color filter, a display or the like. Accordingly, the AR coating is provided internally such that the single substrate transparent body has a boundary towards an air gap by the AR coating.

Due to the structure of the transparent layer stack, it is facilitated that the conductive film does not prejudice an optimal transmission of light through the body. In particular, a transparent layer stack according to embodiments herein facilitates that a conductive film, even a structured conductive film, does not affect the neutrality of the reflectance color, as further discussed below.

In the past, it has been shown that a transparent layer stack with dielectric layers having predetermined refractive indices can be used to improve the visual appearance of touch panels. However, particularly for additional AR and/or AF coating according to embodiments described herein, and also optionally for thicker (low resistance) TCO structures, additional effort needs to be taken. Thereby, particularly the optical properties of a majority of the layers in the transparent layer stack have to be considered. That is beyond the compensation of a patterned TCO layer on a substrate by use of dielectric layers, which has initially been done irrespective of the bonding scheme and other properties, the refractive index of a transparent adhesive, the refractive index of an AR coating, and preferably also the optical properties, e.g. the refractive index, of an AF coating are combined to an entire structure, wherein the improvement of visual appearance is conducted for the entire body. Thereby, according to embodiments described herein, which can be combined with other embodiments described herein, the transparent body is a single substrate structure, and i.e. the transparent body includes only one substrate.

According to embodiments described herein, an enhanced structure and method of manufacturing such an invisible object, e.g. a touch sensor, are provided to surpass limitations to the use of AR and/or AF coatings and arising from the integration thereof. Layer stacks or transparent bodies as described herein, which are provided on a display, or the like, are considered invisible when placed in an atmosphere of air (refractive index 1) with very little difference in the optical appearance between areas with and without the TCO layer, such as ITO ("invisible" ITO).

As shown in FIG. 2A a transparent adhesive 24 is provided over the TCO layer 22, i.e. such that the TCO layer 22 is between the transparent adhesive and the substrate. According to typical, optional implementation, the transparent adhesive can be an optical clear adhesive laminate or liquid optical clear adhesive with a refractive index of 1.3 to 1.8, e.g. a refraction index close to the refractive index of glass (1.48) or PMMA (1.6), hence, as a further example, in the range between 1.48 and 1.6. According to yet further embodiments, which can be combined with other embodiments described herein, the transparent adhesive 24 can have a visual transmittance of 95% or above, 97% or above, or even 99% or above, and can have a low haze, e.g. of 3% or below, 2% or below, or even 1% or below. Thereby, the optical properties of the transparent adhesive are typically taken into account for forming the transparent body with the improved visual appearance.

According to typical embodiments, which can be combined with other embodiments described herein, the transparent adhesive can be configured for attaching the layer stack or transparent body to the adjacent components of the touch panel or display panel, e.g. any of the opto-electronic devices (touch screens, color filters, touch panels, displays, display panels, etc.) for which the transparent body can be utilized.

According to embodiments described herein, which can be combined with other embodiments described herein, the AR coating can include two, three, four or more dielectric layers, wherein typically a first layer has a first refractive index and a second layer has a second refractive index different from the first refractive index. For example, the first layer can be NbOx, e.g. Nb2O5 and the second layer can be SiOx, e.g. SiO2. Further, layers can also be NbOx and SiOx in alternation. Thereby, films having lower refractive indexes can be provided by films containing SiOx, MgFx, SiOxNy, or the like. For example, films having a higher refractive index can be provided by films containing NbOx, NbOxNx, SiNx, SiOxNy, AlOx, AlOxNy, TiOx, TiOxNy, TaOx, or the like. According to typical embodiments, which can be combined with other embodiments described herein, dielectric films with lower refractive index, for example lower than 1.60 or, more specifically, lower than 1.52 or, even more specifically, lower than 1.49 and dielectric films with higher refractive index, for example of at least 1.80 or, more specifically, at least 2.10, or, even more specifically, at least 2.30 are provided in an alternating manner.

According to typical embodiments, which can be combined with other embodiments described herein, the first dielectric film being deposited on the substrate can typically be a high refractive index layer, e.g. with a refractive index of at least 1.8 For example, a niobium-oxide containing film can be deposited as the first dielectric film on the substrate.

The embodiments depicted in FIGS. 1A, 1B, 2A and 2B show two dielectric layers in the transparent layer stack 12 and the AR coating 40. However, according to yet further embodiments, one layer with a gradient refractive index or more than two layers can also be provided in the transparent layer stack 12 and the AR coating 40.

According to yet further typical embodiments, the dielectric films 16, 18 and 20 can be layers including oxides, nitrides or oxinitrides, wherein the respective oxide, nitride or oxinitride includes at least 70 weight-%, typically at least 90 weight-% of the respective oxide-compound, nitride-compound, or oxinitride-compound. Thereby, either a layer structure for high transparency or a layer structure with improved transmission characteristics, as described below, can be provided.

More specifically, according to embodiments herein, the first, optionally a third dielectric film, or further dielectric films, can be a film, e.g. consisting of SiO2, having a lower refractive index than the second dielectric film, e.g. consisting of Nb2O5, Si3N4 or the like. However, starting with a low refractive index film might be a beneficial option for some specific cases only. As described above, typically, the first dielectric layer provided onto a substrate would have a high refractive index. A first transparent layer stack of a transparent body, e.g. a three-layer-type stack, manufactured according to embodiments herein provides, in view of the additional dielectric films in comparison to at least some known transparent bodies for use in a touch panel and the characteristic combination of films with different refractive indexes, a barrier that facilitates a proper transmission of light through the transparent body. According to typical embodiments, which can be combined with other embodiments described herein, dielectric films with lower refractive index, for example lower than 1.60 or, more specifically, lower than 1.52 or, even more specifically, lower than 1.49, and dielectric films with higher refractive index, for example of at least 1.80 or, more specifically, at least 2.10, or, even more specifically, at least 2.30 are provided in an alternating manner. Thereby, films having lower refractive indexes can be provided by films containing SiOx, MgFx, SiOxNy, or the like. For example, films having a higher refractive index can be provided by films containing NbOx, SiNx, SiOxNy, AlOx, AlOxNy, TiOx TaOx, or the like.

According to embodiments described herein, transparent body 10 includes a transparent conductive film 22, such as, but not limited to, indium tin oxide (ITO), in particular, poly-crystalline ITO or ITO with a sheet resistance of 100 Ohm/square and below.

According to yet further embodiments, which can be combined with other embodiments described herein, ITO 90/10 is usually used when there are no or relaxed temperature constraints with respect to a substrate. Since ITO 90/10 does not crystallize at low temperatures (e.g. of about 130°~230° C.) as easily as ITO 95/5 or 97/7, the latter compositions can be helpful to reach a better sheet resistance at a given deposition temperature, which is limited by the substrate.

FIG. 3 illustrates manufacturing of a transparent layer stack or transparent body, which can be used, for example, for a touch panel display. As shown in FIG. 3A, the layer stack 12 is provided over the transparent substrate 14. According to different embodiments, the transparent substrate can be a flexible substrate or a rigid substrate, an organic substrate or an inorganic substrate, can be a glass or a foil, and can have other characteristics like being linearly or circular polarizing, a lambda quarter retarder or non-polarizing. Typically, the transparent substrate can have a high degree of transparency in the visible range of 380 nm to 780 nm.

According to some embodiments, which can be combined with other embodiments described herein, a substrate can include opaque or colored regions, e.g. black matrix for the touch screen bezel, or metal leads in the bezel zone, or metal based bridges, which are used to connect different transparent conductor electrodes.

According to yet further examples, the transparent substrate 14 can include glass (flexible or rigid), plastic (flexible or rigid), which can further be already covered with thin film layers, a hard coat or lacquer, a linear or circular polarizer material, or lambda quarter retarder. Particularly for glass substrates, deposition processes and manufacturing methods on the glass substrate can be provided at higher temperatures as compared to plastic substrates. For example temperatures of 150° C. or above or even temperatures of 200° C. or above, such as 300° C., can be utilized for manufacturing of transparent bodies for the touch panel display on glass substrates.

According to yet further embodiments, which can be combined with other embodiments described herein, the layer stack 12 is typically an optical matching layer stack having at least a first and a second dielectric film, Wherein the first refractive index is provided by the first dielectric film and the second refractive index is provided by the second dielectric film, and wherein the second refractive index is different from the first refractive index. According to an exemplary implementation, which can be combined with other embodiments described herein, a first dielectric film, a second dielectric film and a plurality of further dielectric films can be deposited such that a continuous or quasi-continuous (e.g. step-like with small steps) change in refractive index can be generated in the transparent layer stack 12. This may also be referred to as one dielectric layer with a gradient in refractive index. According to typical implementations, the dielectric films can be manufactured by chemical vapor deposition or physical vapor deposition, for example sputtering or evaporation. Typical examples can be insulating materials with high and low refractive indexes, for example SiOx, TiOx, TiOxNy, NbOx, NbOxNy, SiNx, SiOxNy, AlOx, AlOxNy, TaOx, TaOxNy, and combinations thereof.

Within the present disclosure it is referred to optical matching, optical matching layers and/or optical matching layer stacks, etc. The utilized optical matching systems generally is not merely directed to an refractive index matching between e.g. a substrate and a patterned TCO, i.e. using an intermediate refractive index between the adjacent materials or a sequence of gradually changing indices to match gradually between the adjacent refractive indices (typically in order to reduce reflectance at the interface of two materials). The term "optical matching" addresses further improved functions for invisibility of the transparent TCO, e.g. ITO. The term "optical matching" includes index matching single layers, index gradient layers as well as high/low refractive index alternations for designed optical interference.

Figure 3A:
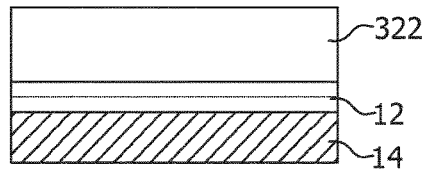
FIGS. 3A to 3E are schematic representations of the manufacturing of an exemplary transparent body for use in a touch panel in accordance with embodiments herein.

As shown in FIG. 3A, a transparent conductive oxide layer 322 is deposited over the layer stack 12. According to yet further embodiments, which can be combined with other embodiments described herein, the transparent conductive oxide layer can also be provided as a transparent conductive oxide layer stack having one or more transparent conductive oxide films. During manufacturing, the transparent conductive oxide film or transparent conductive film stack can be heated during or after deposition, for example by thermal heating or by RTP flashlights. Typically, the transparent conductive oxide can be heated to temperatures of 80° C. or above. The manufacturing of the transparent conductive oxide films can be provided by chemical vapor deposition or physical vapor deposition, e.g. sputtering or evaporation. In order to provide a high yield of manufacturing, for example DC sputtering of a transparent conductive oxide layer from a rotatable target can be provided. Typical examples of the transparent conductive oxide or the transparent conductive oxide (TCO) layer stack can be ITO, doped ITO, impurity-doped ZnO, $In_2O_3$, $SnO_2$ and CdO, ITO (In2O3:Sn), AZO (ZnO:Al), IZO (ZnO:In), GZO (ZnO:Ga), multi-component oxides including or consisting of combinations of ZnO, $In_2O_3$ and $SnO_2$, a layer stack from at least an ITO layer and a metal layer, e.g. an ITO/metal/ITO-stack or a metal/ITO/metal-stack.

Figure 3B:
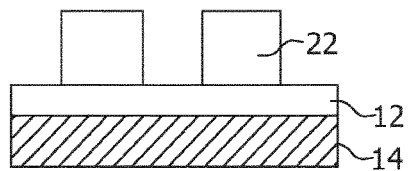

As shown in FIG. 3B, the transparent conductive oxide layer 322 (see FIG. 3A) is structured to provide a structured transparent conductive oxide layer 22. The structured TCO layer can be provided by depositing a TCO layer and patterning the TCO layer in order to provide a structured TCO layer. Further, a mask and/or a photoresist can be provided to deposit the structured TCO layer.

Figure 3C:
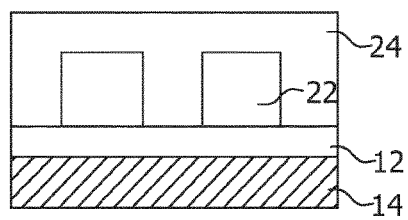
Figure 3D:
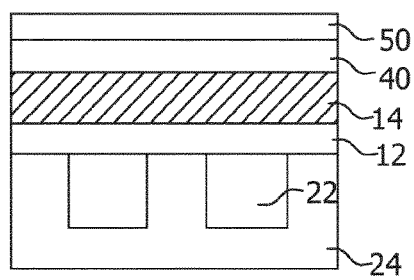
Figure 3E:
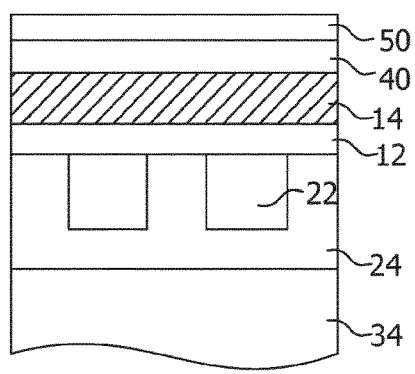

FIGS. 3C to 3E illustrate a transparent adhesive 24, such as an optically clear adhesive in order to provide invisibility of the structured transparent conductive oxide layer 22 together with the transparent layer stack 12, when the transparent body is bonded to the display 34 or another portion of an optoelectronic device, e.g., a color filter or the like. According to different embodiments, the transparent adhesive can be an optical clear adhesive laminate or liquid optical clear adhesive with a refractive index close to a second substrate or polarizer, i.e. the substrate or polarizer of the display 34. For example, the refractive index can be close to the refractive index of glass (1.48) or of PMMA (1.6), for example, in the range between 1.48 and 1.6. According to yet further embodiments, the transparent adhesive can have a visual transmittance of 95% or above, 97% or above, or even 99% or above, and/or a low haze, e.g. of 3% or below, of 2% or below, or even of 1% or below.

As shown in FIG. 3D, an AR coating 40 and an AF coating 50 is provided on the side of the substrate 14, which is opposing the side on which the transparent layer stack 12 is provided. Thereby, according to typical embodiments, which can be combined with other embodiments described herein, the single substrate transparent body, i.e. the transparent body with only one substrate, can be provided as a cover lens for a touch panel, e.g. in a smartphone, a tablet PC or another display with touch functionality. Thereby, the term cover lens is typically used for the outermost transparent body, e.g. a glass with respective layers deposited therein. The term cover lens is further equivalent to cover glass, which may sometimes also be used.

According to embodiments described herein, a structured TCO layer, e.g. an ITO layer, and an optical matching layer are provided on a first side of the substrate. An AR coating and/or an AF coating provided on the second side of the substrate opposing the first side.

According to one embodiment, optionally a transparent adhesive configured for bonding to a display, a color filter, an electro-optical device, or the like, is provided such that the optical matching layer and the transparent adhesive together provide essentially invisibility of the structures of the TCO in the final assembled touch screen device. Accordingly, the layer stack or transparent body, for example a touch panel layer stack, can be bonded to or integrated in a display device with improved visual and electrical characteristics. According to yet further embodiments, a bonding to an adjacent portion of an optoelectronic device can also be provided with an air-gap.

A single substrate transparent body, such as a cover lens as shown in FIGS. 1A and 1B, can be provided with a transparent adhesive as illustrated. Thereby, the TCO layer 22 is typically provided between the transparent layer stack 12, i.e. the optical or index matching stack and the transparent adhesive. That is, the TCO layer is sandwiched between the transparent layer stack and the transparent adhesive.

Alternatively, the embodiments described with respect to FIGS. 1A and 1B can be modified by mounting the transparent body to an adjacent portion of an optoelectronic device with an air gap instead of the transparent adhesive. Thereby, typically, a second transparent layer stack is provided such that the TCO layer 22 is provided between the first and the second transparent layer stack. The second transparent layer stack includes at least one dielectric layer, typically two dielectric layers with different refractive indices. Accordingly, the TCO layer is sandwiched between two optical matching stacks, that is the first transparent layer stack 12 and at least one of a second transparent layer stack and a transparent adhesive.

According to embodiments described herein, if a transparent adhesive is provided, it should be considered that the transparent adhesive can be selected to have a predetermined refractive index in order to be incorporated in the optical matching.

According to yet further embodiments, the embodiments illustrated with respect to FIGS. 1A to 2B can further be modified that the patterned transparent conductive film is provided over the substrate or on the substrate and an optical matching stack 12 is provided over the transparent conductive film. According to different modifications of such an implementation, a bonding to an adjacent portion of an optoelectronic device can be conducted with a transparent adhesive or an air gap. However, according to some embodiments, which can be combined with other embodiments described herein, it is beneficial if the TCO is provided between layers utilized for an optical matching property. This can either be between two optical matching stacks, between an optical matching stack an a transparent adhesive, wherein the optical matching stack and the transparent adhesive cooperate for optical matching, or between an optical matching stack an a yet further dielectric layer, wherein the optical matching stack and the yet further dielectric layer cooperate for optical matching. Thereby, it is understood that an index gradient layer would rather be considered similar to an optical matching stack as compared to a single dielectric layer.

Figure 4:
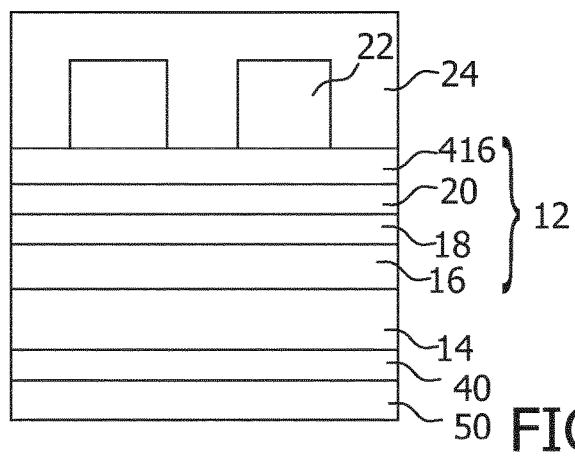
FIG. 4 is a schematic representations of yet further exemplary transparent bodies for use in a touch panel in accordance with embodiments herein.

FIG. 4 illustrates yet further embodiments, which can be combined with other embodiments described herein. As shown in FIG. 4, the substrate of the transparent body, which can for example be used in a touch panel, is provided. The substrate can be, for example, the cover lens after the transparent touch body is bonded to an electro-optical device, such as a display or the like. The embodiments described with respect to FIG. 4 include four dielectric layers 16, 18, 20 and 416, which form a transparent layer stack. On top of the transparent layer stack, the structured transparent conductive film 22 is provided. According to typical embodiments, which can be combined with other embodiments described herein, the transparent conductive oxide film can be a TCO layer, which is deposited by DC sputtering from a rotatable target. However, other position techniques might be applied as well. Sputtering from a rotatable target is, for example useful for manufacturing of large area devices.

According to some embodiments, large area substrates or respective carriers, wherein the carriers have a plurality of substrates, may have a size of at least 0.174 m$^2$. Typically, the size can be about 0.67 m$^2$ (0.73×0.92 m—Gen 4.5) to about 8 m$^2$, more typically about 2 m$^2$ to about 9 m$^2$ or even up to 12 m$^2$. Typically, the substrates or carriers, for which the structures, apparatuses, such as cathode assemblies, and methods according to embodiments described herein are provided, are large area substrates as described herein. For instance, a large area substrate or carrier can be GEN 4.5, which corresponds to about 0.67 m$^2$ substrates (0.73×0.92 m), GEN 5, which corresponds to about 1.4 m$^2$ substrates (1.1 m×1.3 m), GEN 7.5, which corresponds to about 4.29 m$^2$ substrates (1.95 m×2.2 m), GEN 8.5, which corresponds to about 5.7 m$^2$ substrates (2.2 m×2.5 m), or even GEN 10, which corresponds to about 8.7 m$^2$ substrates (2.85 m×3.05 m). Even larger generations such as GEN 11 and GEN 12 and corresponding substrate areas can similarly be implemented.

The optical matching layer stack 12, as shown in FIG. 4, together with the transparent adhesive 24 for bonding of the transparent body to a display or the like results in improved optical characteristics. The structures of the TCO layer are essentially invisible to the user of such a device due to the transparent layer stack and the transparent adhesive. According to some embodiments described herein, this can be provided for the transparent conductive films having a sheet resistance of 100 Ohm/square or below, for example transparent conductive oxide layers of 40 nm or above, or even 100 nm or above.

According to different embodiments, which can be combined with other embodiments described herein, two or more dielectric layers can be provided in the transparent layer stack 12 and/or a further transparent layer stack, which can be provided to sandwich the TCO between two transparent layer stacks.

According to yet further embodiments, the two or more layers can be a plurality of dielectric layers or films, for example, such that a gradient in the refractive index in the layer stack is provided. For example, a first dielectric film can be provided with a first refractive index and the refractive index can be changed during further deposition of the transparent layer stack. The change can be continuous or step-like. Accordingly further dielectric films (16-20; 416) can be provided, wherein a refractive index can be obtained in the transparent layer stack. Thereby, for example SiOxNy can be deposited wherein the amount of oxygen and nitrogen is continuously or step-wise changed from y=1 to y=0 and from x=0 to x=2 or vice versa.

As described above, according to some embodiments described herein, the films in the transparent layer stack, which acts as an optical matching layer stack, and the transparent conductive adhesive (or another optical matching transparent layer stack) are provided with refractive indices, respectively, such that the patterning of the structured TCO layer or the structure layer stack including a TCO layer appears essentially invisible for a user of an optoelectronic device, e.g. a touch panel. However, according to yet further embodiments, which can be combined with other embodiments described herein, an optical matching functionality of the transparent adhesive can also be provided by a further dielectric film, which is provided between the transparent conductive film and the transparent adhesive. According to typical implementations thereof, the further dielectric layer provided onto the transparent conductive film, e.g. in direct contact with the transparent conductive film, can be a dielectric film with a low refractive index. For example, the refractive index can be 1.60 or below. According to yet further optional modifications of such embodiments, one or more further dielectric films can be deposited over the transparent conductive film. Typically, the one or more dielectric films can be selected from the group consisting of: SiOx, TiOx, TiOxNy, NbOx, NbOxNy, SiNx, SiOxNy, AlOx, AlOxNy, TaOx, TaOxNy and combinations thereof. Accordingly, processes described herein may include one or more further deposition steps of such layers and apparatuses for manufacturing may include one or more further deposition assemblies for depositing such layers.

According to yet further embodiments, which can be combined with other embodiments described herein, the combination of the transparent layer stack 12 and the transparent conductive film can be repeated twice, three times or even four times. For each of the transparent conductive films, the pattern structure and/or pattern direction can be different as compared to another structured TCO layer.

Figure 5A:
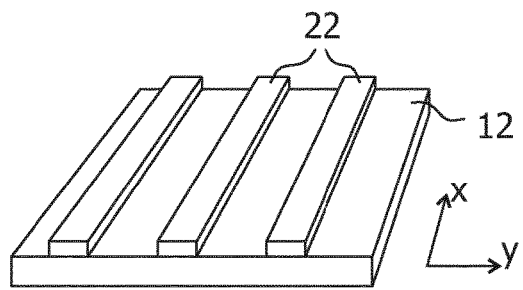
FIGS. 5A and 5B are schematic representations of exemplary TCO structures which can be used in embodiments described herein.

As shown in FIG. 5A, a TCO layer 22 deposited over or on the dielectric layer can be patterned to have structures extending along a first direction, e.g. the x-direction shown in FIG. 5A. The TCO layer 22 is shown on the transparent layer stack 22 and the other device portions provided according to embodiments described herein are omitted. With such a patterned TCO layer, a transparent body can be provided, which is capable of detecting a touch position in one direction, e.g. the y-direction shown in FIG. 5A. A two-dimensional touch detection can thereby be provided by having a second transparent body with TCO structures extending along a second direction different from the first direction, e.g. the y-direction. According to some embodiments, which can be combined with other embodiments described herein, the first transparent body (x-direction structures) can be a transparent body as described with respect to FIG. 1A, where instead of the transparent adhesive, as a further alternative, an air gap can be provided. Thereby, the second transparent body (y-direction structures) can be a transparent body as described with respect to FIG. 2A and the air gap shown in FIG. 2A can be an air gap for mounting the two transparent bodies to a display or a further portion of a display.

Figure 5B:
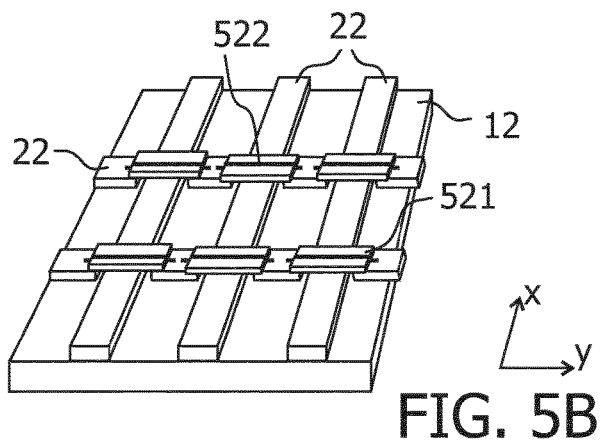

Another alternative of how to provide a TCO layer or a TCO layer stack according to embodiments described can be described with respect to FIG. 5B. A first TCO x-y-grid layer 22 is provided on the transparent layer stack 12. The x-y-grid layer has a two-dimensional pattern extending in x-direction and y-direction. The TCO structures in y-direction are not connected in the layer plane of layer 22. A insulating layer 512, e.g. a patterned insulating layer, is provided over the TCO layer 22. According to some embodiments, the insulating layer can also be a stack of dielectric layers with different refractive indices to provide for further enhanced optical matching. Bridges 522 are provided for electrically connecting the unconnected portions of the TCO layer, i.e. the portions extending in y-direction in FIG. 5B. Thereby, a two-dimensional TCO grid with electrically insulated independent directions can be provided. According to typical embodiments, which can be combined with other embodiments described herein, the bridges 522 can also include a transparent conductive oxide (TCO) and can include any of the TCO materials described herein. According to some embodiments, the TCO layer 22 of embodiments described with respect to FIGS. 1 to 5A, can be replaced by the structure including the TCO layer 22, the insulating layer 512 and the bridge 522 described with respect to FIG. 5B.

As explained above, AR coatings and/or AF coatings are desired for touch panel devices. However, a substrate with AR coating and/or AF coating gives rise to increased pattern visibility for patterned TCO layers in touch panels. According to embodiments described herein, a single substrate with AR coating and/or AF coating on one side and "invisible TCO", e.g. an "invisible ITO" on the other side of the substrate is provided. Thereby, the term "invisible" is understood as a combination of the patterned TCO layer and one or more optical matching layers or optical matching layer stacks. Typically, the TCO layer can be provided between at least two optical matching layers or optical matching layer stacks. Thereby, it should be considered that a transparent adhesive can be chosen to have predetermined optical properties, e.g. a refractive index of 1.3 to 1.8, such that the transparent adhesive participates in the optical matching for improving the invisibility of the TCO pattern.

Providing a single substrate solution can thereby provide one or more of the below benefits. The resulting transparent body has an enhanced form factor, i.e. is thinner and lighter, wherein the reduced weight can be exemplarily important for mobile devices and laptops. Further, the solution can provide reduced costs because less substrates are provided. Yet further, the integration of several layers in one transparent body allows for better optical matching and, thus, enhanced optical appearance (e.g. sunlight readability, pattern invisibility). There are reduced disturbances from fingerprint without compromising on TCO pattern visibility. Beyond that, the manufacturability of enhanced touch screen functionality is enhanced.

According to certain embodiments, the first transparent layer stack, the transparent conductive film, and the transparent adhesive or another transparent layer stack instead of the transparent adhesive are deposited in a manner such that $\Delta E^*_{ab}$, that is the CIELAB color space difference of regions with and without TCO, is 4 or below, particularly 3 or below, more particularly 1.5 or below. Yet, further the a* and b* value for the manufactured transparent body after being integrated and assembled with the display to the final touch screen device is below 1.5 or, in particular 1, or more specifically, 0.7, or, even more specifically, 0.5. In particular, according to embodiments herein, the a* and b* value for the structure formed solely by the first transparent layer stack, the transparent conductive film, and the transparent adhesive, placed above a substantially transparent substrate may adopt these values.

Figure 6:
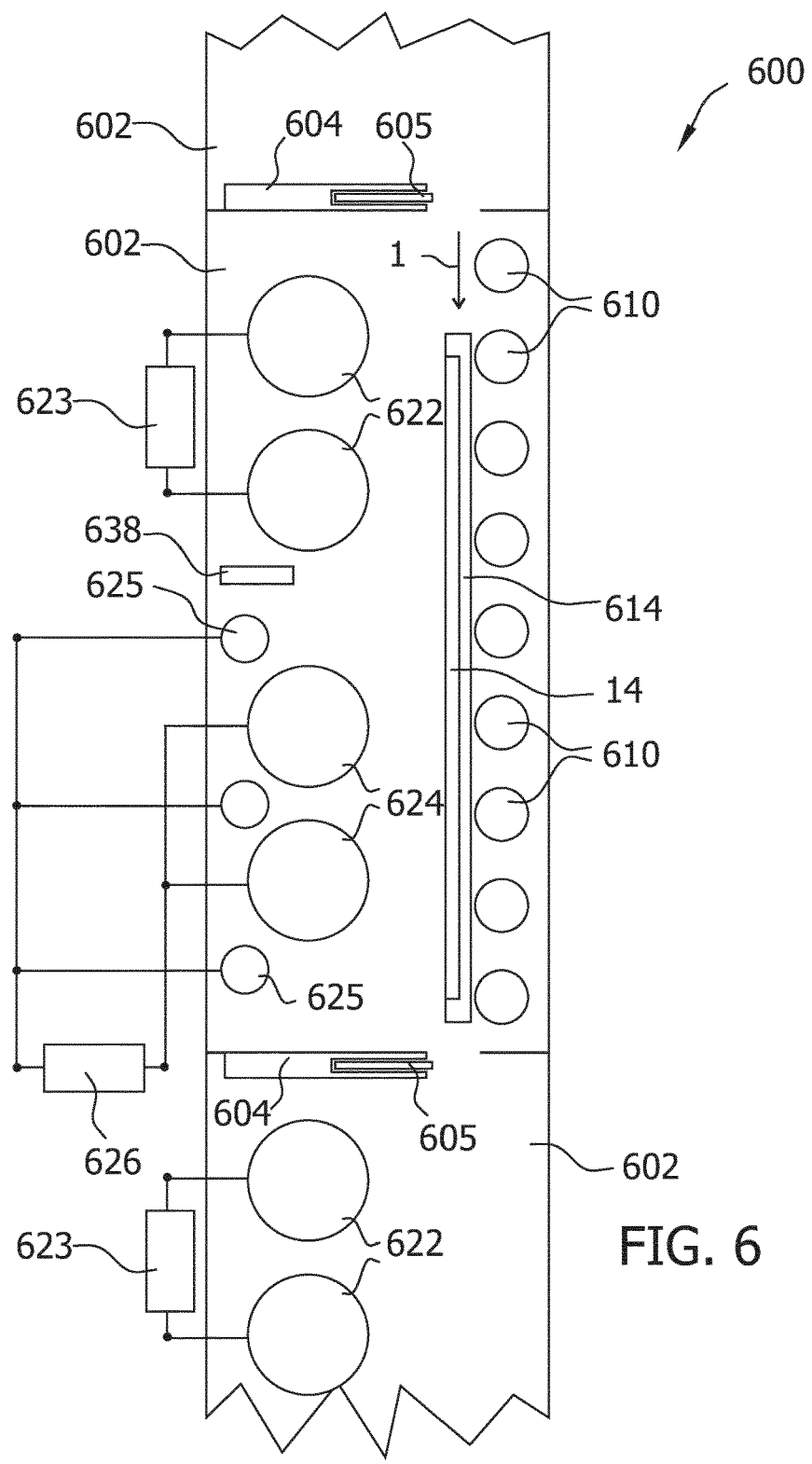
FIG. 6 is a schematic representation of a portion of an apparatus for depositing an exemplary transparent body for use in a touch panel in accordance with embodiments herein.
Figure 7:
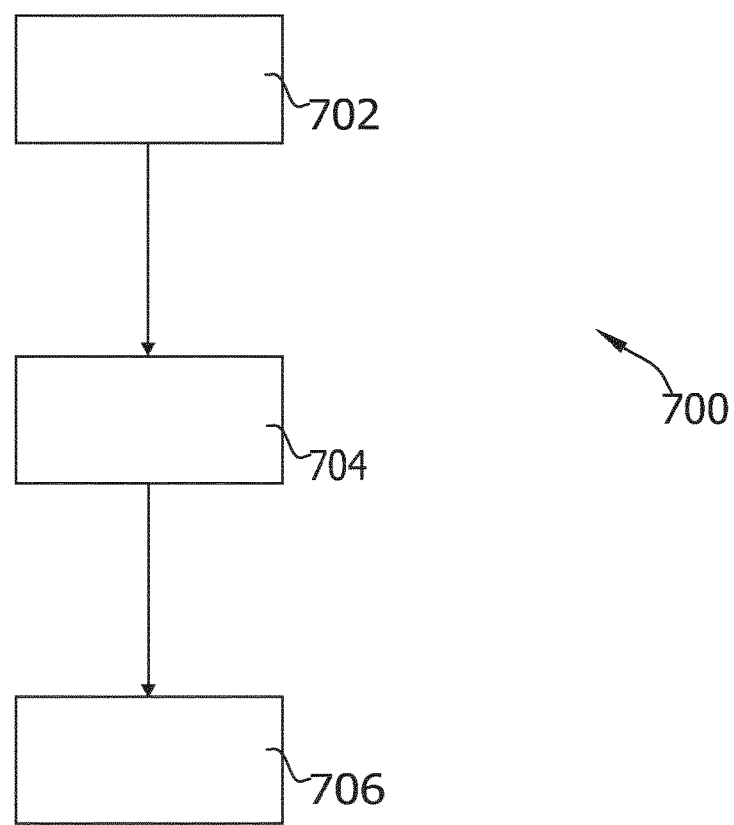
FIG. 7 is a flow chart illustrating methods of manufacturing a transparent body for use in a touch panel in accordance with embodiments herein.

FIG. 6 shows a deposition apparatus 600. Exemplarily, one vacuum chamber 602 for deposition of layers therein is shown. As indicated in FIG. 6, further chambers can be provided adjacent to the chamber 602. The vacuum chamber 602 can be separated from adjacent chambers by a valve having a valve housing 604 and the valve unit 605. In some cases (e.g. between a chamber for depositing a dielectric layer and a chamber for depositing a TCO layer, the adjacent chambers are separated by a (extended) slit valve constructions, e.g. a narrow long gap separating the atmospheres. Thereby, after the carrier 614 with the substrate 14 thereon is, as indicated by arrow 1, inserted in the vacuum chamber 602, the valve unit 605 can be closed. Accordingly, the atmosphere in the vacuum chambers can be individually controlled by generating a technical vacuum, for example with vacuum pumps connected to the chamber 602, and/or by inserting process gases in the deposition region in the chamber.

According to typical embodiments, process gases can include inert gases such as argon and/or reactive gases such as oxygen, nitrogen, Hydrogen (H2) and ammonia (NH3), Ozone (O3), activated gases or the like. Within the chamber 602, rollers 610 or another transport system such magnet rails or the like are provided in order to transport the carrier 614 having the substrate 14 thereon into and out of the chamber 602.

Within the chamber 602, two different groups of deposition sources 622 and 624 are illustrated in the top view shown in FIG. 6. As described in more detail below, the groups of deposition sources can typically be provided in different chambers in the event different deposition processes are provided by the groups of deposition sources.

The deposition sources can for example be rotatable cathodes having targets of the material to be deposited on the substrate. Typically, the cathodes can be rotatable cathodes with a magnetron therein. Thereby, magnetron sputtering can be conducted for depositing of the layers. Cathodes 622 are connected to an AC power supply 623 such that the cathodes can be biased in an alternating manner. In some cases the cathodes are connected to DC or uni-polar pulsed power-supplies.

As used herein, "magnetron sputtering" refers to sputtering performed using a magnet assembly, that is, a unit capable of generating a magnetic field. Typically, such a magnet assembly consists of a permanent magnet. This permanent magnet is typically arranged within a rotatable target or coupled to a planar target in a manner such that the free electrons are trapped within the generated magnetic field generated below the rotatable target surface. Such a magnet assembly may also be arranged coupled to a planar cathode.

Thereby, magnetron sputtering can be realized by a double magnetron cathode, i.e. cathodes 622, such as, but not limited to, a TwinMag™ cathode assembly. Particularly, for MF sputtering from a silicon target, target assemblies including double cathodes can be applied. According to typical embodiments, the cathodes in a deposition chamber may be interchangeable. Accordingly, the targets are changed after the target material has been consumed.

According to typical embodiments, dielectric layers can be deposited by sputtering, for example magnetron sputtering, of rotatable cathodes having an AC power supply. Typically, MF sputtering can be applied for depositing the dielectric layers. Thereby, according to typical embodiments, sputtering from a silicon target, e.g. a sprayed silicon target, is conducted by MF sputtering, that is middle frequency sputtering. According to embodiments herein, middle frequency is a frequency in the range 5 kHz to 100 kHz, for example, 10 kHz to 50 kHz.

Sputtering from a target for a transparent conductive oxide film is typically conducted as DC sputtering. The cathodes 624 are connected to the DC power supply 626 together with anodes 625 collecting electrons during sputtering. Thus, according to yet further embodiments, which can be combined with other embodiments described herein, the transparent conductive oxide layers, for example, the ITO layers can be sputtered by DC sputtering, i.e. an assembly having cathodes 624.

For simplicity, the upper cathodes 622 and the cathodes 624 are illustrated to be provided in one vacuum chamber 602. Typically, as exemplarily indicated by lower cathodes 622, the cathodes for depositing different layers are provided in different vacuum chambers, for example, the chamber 602 and the vacuum chambers adjacent to the vacuum chamber 602. This is particularly true as the dielectric layers, as described herein, which can be oxide-layers, nitride-layers, or oxinitride-layers, can be deposited by a reactive deposition process where the target material reacts with oxygen and/or nitrogen after the material has been released from the target. By providing the groups of cathodes in different chambers, an atmosphere with an appropriate processing gas and/or the appropriate degree of technical vacuum can be provided in each deposition area.

According to yet further embodiments, depending on the number of dielectric layers deposited on the substrate 14, two or more groups of cathodes 622 can be provided in the deposition apparatus 600.

According to typical embodiments, deposition is performed by sputtering of one or more rotatable targets. More specifically, according to embodiments herein, at least one of the films referred to above is deposited by sputtering of a rotatable target, so that formation of a stable transparent body and with a high quality is facilitated. For example, according to embodiments herein, a film may be deposited having a higher uniformity, and with a low density of defects and contamination particles. Thereby, the manufacture of a high-quality transparent body is facilitated, which not only yields a proper transmission of light but also yields a stable performance over time. Furthermore, a manufacturing process including sputtering of one or more rotatable targets may further facilitate a higher manufacturing rate and the production of a lower number of contaminant particles as compared to other deposition methods.

FIG. 700 shows a flowchart 700 illustrating a process for manufacturing a transparent body as described herein. In step 702, the first transparent layer stack (e.g. layers stack 12) is deposited over the transparent substrate. Thereby, the layer stack includes at least two dielectric films, wherein the refractive indices of the dielectric films are different from each other and films with a higher refractive index and films with a lower refractive index can be deposited in an alternating manner. In step 704, the structured transparent conductive film, for example structured ITO layer, is deposited over the transparent layer stack 12. According to different implementations, which can be combined with other implementations described herein, the structured transparent conductive film can be also a stack of conductive films. For example, a TCO/metal/TCO-stack, for example, an ITO/metal/ITO-stack, or a structure as described with respect to FIG. 5B can be provided in step 704.

According to typical embodiments, which can be combined with other embodiments described herein, structuring procedures can be selected from the group consisting of: (1) laser scribing, (2) photo lithography, (3) printing adsorption barrier pattern (e.g. oil) followed by TCO deposition, (4) a lift-off process (formation of photo-resist pattern on substrate followed by TCO deposition and lift-off with photo-resist solvent), (5) film deposition using a shadow mask, or combinations thereof.

According to certain embodiments, one or some of the chambers may be configured for performing sputtering without a magnetron assembly. One or some chambers, for example additional chamber, may be configured for performing deposition by other methods, such as, but not limited to, chemical vapor deposition or pulsed layer deposition.

Invisible ITO solutions have extremely high demands on the optical uniformity of optical properties (color values in transmission and reflection). This corresponds technically to the deposition of uniform films with respect to film thickness and optical dispersion properties. Accordingly, the deposition apparatuses as described herein can further include a measurement system 638 configured for measuring during deposition optical properties of at least one of the films forming part of at least one of the first layer stack or the transparent conductive film.

Further, as described above, the dielectric films can be typically reactively sputtered. Accordingly, the first deposition assembly (622) can be configured for depositing the dielectric films by reactive sputtering. According to typical embodiments, Si-containing layers can be sputtered reactively, and/or Nb-containing layers or ITO-containing layers can be sputtered from a ceramic target.

According to certain embodiments, exemplary process 700 may further include a heating treatment of the substrate for degassing of the substrate prior to deposition. For example, the substrate may be heated at a temperature between 60° C. and 300° C. depending on the substrate speed. According to certain embodiments, exemplary process 700 may include performing a DC and/or medium frequency (MF) pre-treatment of the substrate with a power between 1 or 3 kW. Moreover, exemplary process 700 may include performing a pre-treatment of the substrate at an argon and/or oxygen atmosphere such as, for example, an oxygen rich pre-treatment. According to embodiments herein, medium frequency is a frequency in the range of 5 kHz to 100 kHz, for example, 30 kHz to 50 kHz.

The sputter coating sources in the exemplary deposition apparatuses or in an apparatus according to embodiments herein may be a DC-cathode with planar or rotatable targets (such as, but not limited to, ceramic ITO), and planar or rotatable targets (such as a doped silicon target, in particular sprayed Si targets for depositing $SiO_2$, or $Si3N4$, $SiOxNy$) or targets including a material to deposit one of the other dielectric layers disclosed herein.

In step 706, at least one of an AR coating and an AF coating is provided on the side of the substrate opposing the side of the substrate on which the transparent layer stack and the TCO layer are provided. Thereby, if the transparent body is provided as a cover lens of a touch screen product, at least an AF coating is provided, i.e. either an AF coating, an AF coating and an AR coating or an AF coating with and additional dielectric layer to form a combined AF/AR coating, is provided. Alternatively, if the transparent body is provided as an inner portion of a touch screen product, an AR coating is provided which is configured to form the boundary to an air gap for connecting the transparent body to a further portion of a touch screen product.

According to some modification, which can be combined with other embodiments described herein, the air gap can also be a gap for another gas different from air.

As described above, according to some embodiments, which can be combined with other embodiments described herein, the transparent body, i.e. the thin film stacks, are produced involving magnetron sputtering from rotary targets. Invisible ITO solutions have extremely high demands on the optical uniformity of optical properties (color values in transmission and reflection), which corresponds technically to the deposition of very uniform films with respect to film thickness and optical dispersion properties. Accordingly, longer targets than the targeted sputtering height can be utilized. Thereby, sputtering from rotary targets offers advantages regarding yield, material utilization, machine up time and finally production costs, while planar targets have re-deposition zones, which are responsible for enhanced arcing and particle generation, and hence need to be much longer than rotary targets to provide for particle-free and uniform films. According to yet further embodiments, which can be combined with other embodiments described herein, the vertical film uniformity, i.e. optical thickness of the film can be supported, e.g. by segmented gas introduction or corresponding measures.

As described above, for embodiments where the transparent body is provided as a portion of a TSP that is within the entire device (i.e. not a portion of the cover lens), the substrate can be a glass, a foil, a polarizer, a retarder or combinations thereof. This can be advantageous for large TSPs where due to yield issues, lamination is not an option and hence the optical disadvantage from an air-gap integration shall be mitigated by the AR coating. By using a mandatory element as the substrate (e.g. the polarizer), the cost for additional substrate can be saved. Again, the AR coating leads to a more pronounced pattern visibility, while "Invisible TCO", i.e. the patterned TCO with the optical matching elements according to embodiments described herein, instead of the conventional ITO, can be used as a countermeasure. According to embodiments described herein, for cover lenses and internal transparent bodies, the AR coating stack or stacks and the "Invisible TCO stacks" are designed specific to the integration scheme of the transparent body, preferably the entire transparent body, to assure high optical performance of the final integrated TSP or display product.

According to yet further embodiments, which can be combined with other embodiments described herein, the color appearance of the AR coating and/or of the AF coating can be selected to compensate for a color appearance of the "invisible TCO" or vice versa.

According to yet further embodiments, a deposition apparatus for manufacturing a transparent body for use in a touch screen panel is provided. The apparatus includes a first deposition assembly configured to deposit a first transparent layer stack over a first side of a substrate, said first transparent layer stack including at least first dielectric film with a first refractive index, and a second dielectric film with a second refractive index different from the first refractive index, a second deposition assembly configured to deposit a transparent conductive film over the first side of the substrate, and one or more further deposition assemblies configured for depositing at least one first layer over a second side of the substrate wherein the second side opposes the first side, and wherein the at least one further layer is selected from the group consisting of: an anti-reflection layer and an anti-fingerprint layer, wherein at least one of the first deposition assembly or the second deposition assembly or the further deposition assembly comprises a sputtering system operatively coupled to a target, said sputtering system being configured to deposit at least one of the first dielectric film, the second dielectric film, the anti-reflection layer and the anti-fingerprint layer or the transparent conductive film by sputtering of the target. Typically, one or more of these layers are deposited by magnetron sputtering, particularly from a rotary target. According to yet further additional or alternative typical implementations, the system includes a controller with a memory, wherein a computer program product is provided such that a transparent body can be provided if a method according to any of the embodiments described herein is executed by the controller.

The written description uses examples to disclose the invention, including the best mode, and to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other.

While the foregoing is directed to embodiments of the invention, other and further embodiments of the invention may be devised without departing from the basic scope thereof, and the scope thereof is determined by the claims that follow.

The invention claimed is:

1. A process for manufacturing a single-substrate transparent body for use in a touch screen panel, the process comprising:
depositing a first transparent layer stack over a first side of a transparent substrate, the first transparent layer stack being configured for improved structure invisibility of a structured transparent conductive film by at least a high-low refractive index alternation, wherein said first transparent layer stack is selected from the group consisting of a layer stack, wherein the layer stack includes a first dielectric film with a gradient refractive index from a first refractive index to a second refractive index, and a layer stack, wherein the layer stack includes at least a first dielectric film with a first refractive index and a second dielectric film with a second refractive index different from the first refractive index;
providing the structured transparent conductive film over the first transparent layer stack;
providing a second transparent layer stack over the structured transparent conductive film and over the first side of the transparent substrate, wherein the second transparent layer stack includes at least one dielectric film;
providing a transparent adhesive over the at least one dielectric film of the second transparent layer stack; and
depositing at least one first layer over a second side of the transparent substrate wherein the second side opposes the first side, and wherein the at least one first layer is selected from the group consisting of: an anti-reflection layer and an anti-fingerprint layer.

2. The process of claim 1, wherein the transparent substrate is a cover lens and wherein the at least one first layer is an anti-fingerprint layer.

3. The process according to claim 2, further comprising:
depositing at least one second layer being an anti-reflection layer, wherein the at least one second layer is deposited between the cover lens and the anti-fingerprint layer.

4. The process according to claim 1, wherein the anti-reflection layer comprises at least a first anti-reflection dielectric film having a first anti-reflection refractive index.

5. The process according to claim 2,
wherein the transparent adhesive is configured for attaching the transparent body to adjacent components of the touch screen panel.

6. The process according to claim 1, wherein the transparent adhesive has a refractive index of 1.3 to 1.8.

7. The process according to claim 1, wherein the transparent substrate is a substrate to be embedded in the touch screen panel, and wherein the at least one first layer is an anti-reflection layer.

8. The process according to claim 7, wherein the transparent substrate is connected to a further portion of the touch screen panel with an air gap without a transparent adhesive such that the anti-reflection layer faces the air gap.

9. The process of claim 1, wherein the structured transparent conductive film corresponds to a sheet resistance of 100 Ohm/square or below.

10. The process according to claim 1, further comprising: mounting a first transparent body and a second transparent body to the touch screen panel with an air gap, wherein the providing a structured transparent conductive film for the first transparent body comprises patterning an unstructured deposited transparent conductive film along a first direction and the providing a structured transparent conductive film for the second transparent body comprises patterning an unstructured deposited transparent conductive film along a second direction.

11. The process according to claim 1, wherein the first dielectric film has a refractive index of at least 1.8 and the second dielectric film has a refractive index of 1.60 or below.

12. The process according to claim 1, wherein the dielectric films are sputtered by medium frequency (MF) sputtering from a rotatable target, and the structured transparent conductive film is sputtered by direct current (DC) sputtering from a rotatable target.

13. A single-substrate transparent body adapted for use in a touch screen panel comprising:
a transparent substrate;
a first transparent layer stack deposited over the transparent substrate on a first side of the transparent substrate, the first transparent layer stack being configured for improved structure invisibility of a structured transparent conductive film by at least a high-low refractive index alternation, wherein said first transparent layer stack is selected from the group consisting of:
a layer stack, wherein the layer stack includes a first dielectric film with a gradient refractive index from a first refractive index to a second refractive index different from the first refractive index; and
a layer stack, wherein the layer stack includes at least a first dielectric film with a first refractive index and a second dielectric film with a second refractive index different from the first refractive index;
the structured transparent conductive film deposited over the first transparent layer stack on the first side of the transparent substrate;
a second transparent layer stack over the structured transparent conductive film and over the first side of the transparent substrate, wherein the second transparent layer stack includes at least one dielectric film;
a transparent adhesive over the at least one dielectric film of the second transparent layer stack; and
at least one first layer deposited over a second side of the transparent substrate wherein the second side opposes the first side, and wherein the at least one first layer is selected from the group consisting of an anti-reflection layer and an anti-fingerprint layer.

14. The transparent body of claim 13, wherein the transparent substrate is a cover lens and wherein the at least one first layer is an anti-fingerprint layer, wherein the transparent body further comprises:
at least one second layer being an anti-reflection layer, wherein the at least one second layer is deposited between the cover lens and the anti-fingerprint layer.

15. The transparent body according to claim 13, wherein the transparent substrate is a substrate to be embedded in the touch screen panel, and wherein the at least one first layer is an anti-reflection layer, wherein the transparent substrate is connected to a further portion of the touch screen panel with an air gap without a transparent adhesive such that the anti-reflection layer faces the air gap.

16. The process according to claim 4, wherein the anti-reflection layer further comprises at least a second anti-reflection dielectric film having a second anti-reflection refractive index different from the first anti-reflective refractive index.

17. The process according to claim 11, wherein the anti-reflection layer comprises at least a first anti-reflection dielectric film having a first anti-reflection refractive index.

18. The process according to claim 17, wherein the anti-reflection layer further comprises at least a second anti-reflection dielectric film having a second anti-reflection refractive index different from first anti-reflection refractive index.

19. The process according to claim 4,
wherein the transparent adhesive is configured for attaching the transparent body to adjacent components of the touch screen panel.

20. The process according to claim 19, wherein the transparent adhesive has a refractive index of 1.3 to 1.8.

* * * * *